United States Patent [19]

All et al.

[11] 4,345,005

[45] Aug. 17, 1982

[54] ORIENTED POLYPROPYLENE FILM SUBSTRATE AND METHOD OF MANUFACTURE

[75] Inventors: Frank E. All, Newark; Gary L. Duncan, Pittsford, both of N.Y.

[73] Assignee: Mobil Oil Corporation, New York, N.Y.

[21] Appl. No.: 53,146

[22] Filed: Jun. 28, 1979

[51] Int. Cl.³ .................... B32B 15/08; B05D 3/14
[52] U.S. Cl. .................... 428/461; 156/244.11; 156/244.12; 156/244.24; 204/30; 204/192 R; 427/40; 427/41; 427/172; 427/173; 427/250; 427/295; 427/296; 427/304; 427/322; 427/407.3; 428/515; 428/910
[58] Field of Search .......... 427/306, 250, 40, 41, 427/295, 296, 39, 322, 444, 172, 407 E, 173, 407.3; 156/244.11, 244.12, 244.18, 244.23, 244.24, 244.25; 428/515, 461, 910; 204/30, 192 R

[56] References Cited

U.S. PATENT DOCUMENTS

| | | | |
|---|---|---|---|
| 3,017,339 | 1/1962 | Dewey | 156/244.23 |
| 3,111,419 | 11/1963 | Nahin | 156/244.11 |
| 3,288,638 | 11/1966 | Van Paassen et al. | |
| 3,309,299 | 3/1967 | Mankell | 427/41 |
| 3,397,101 | 8/1968 | Rausing | 428/515 |
| 3,443,980 | 5/1969 | McBride | |
| 3,496,061 | 2/1970 | Freshour et al. | |
| 3,674,536 | 7/1972 | Khelghatian et al. | 428/461 |
| 3,686,018 | 8/1972 | Lindblom et al. | |
| 3,866,288 | 2/1975 | Bernard et al. | 428/461 |
| 3,914,521 | 10/1975 | Beatty et al. | |
| 3,948,709 | 4/1976 | Ida et al. | 156/244.25 |
| 4,117,193 | 9/1978 | Tsuchiya et al. | |
| 4,211,811 | 7/1980 | Bordini et al. | 428/220 |

FOREIGN PATENT DOCUMENTS 1176204 of 1970 United Kingdom ............... 427/173

Primary Examiner—Norman Morgenstern
Assistant Examiner—Janyce A. Bell
Attorney, Agent, or Firm—C. A. Huggett; M. G. Gilman; J. P. O'Sullivan, Sr.

[57] ABSTRACT

An oriented polypropylene film substrate and method of manufacturing an oriented polypropylene film having enhanced adhesion to metallized coatings which comprises the steps of coextruding the film substrate having a homopolymer polypropylene core layer, and an ethylene propylene outer layer on at least one side of the core layer, the core and outer layers containing no slip agent. The film substrate is biaxially oriented, and the outer layer is corona treated. A metal coating is then deposited on the corona treated outer layer.

7 Claims, No Drawings

ORIENTED POLYPROPYLENE FILM SUBSTRATE AND METHOD OF MANUFACTURE

BACKGROUND OF THE INVENTION

Field of the Invention

There is a problem in the prior art to provide a metal coating firmly adhered to polyolefin film surfaces. One approach to solving this problem has been to modify the surface of the polyolefin by various surface oxidation processes. Another process to improve the bond strength between the metal coating and the film involves the application of an adhesive layer to the surface of the film. For example, U.S. Pat. No. 3,567,487 describes the use of a prime coat such as a dispersion or solution of an acid containing polymer such as carboxylated butadiene polymers and maleic anhydride modified atatic poly- propylene polymers.

The prior art also calls for the use of a slip agent to reduce the coefficient of friction of the film to aid in machine handling of such film. Such slip agents may be incorporated in the film. Typical slip agents may be fatty acid amides such as stearamide or oleamide.

SUMMARY OF THE INVENTION

The present invention provides an oriented polypropylene film substrate having enhanced adhesion coating without the use of a prime coating as required by the prior art. Further, it has been discovered that avoidance of the use of a slip agent in the polypropylene film acts to provide enhanced adhesion of such film to a metallized coating.

In accordance with the present invention there is provided a method of manufacturing an oriented polypropylene film having enhanced adhesion to metallized coatings which comprises the steps of coextruding the film substrate having a polypropylene core layer, and adhered thereto an ethylene proplyene outer layer on at least one side of the core layer, the core and outer layers containing no slip agent. The film substrate is biaxially oriented, and the outer layer is corona treated. A metal coating is then deposited on the corona treated outer layer.

In accordance with another aspect of the present invention there is provided an oriented polypropylene film substrate having enhanced adhesion to metallized coating comprising a coextruded homopolymer polypropylene core layer, and an ethylene propylene copolymer outer layer on one side of the core layer, said outer layer being corona treated and said core and said outer layers containing no slip agent.

In accordance with still another aspect of the present invention there is provided an oriented polypropylene film substrate having enhanced adhesion to a metallized coating comprising a coextruded homopolymer polypropylene core layer and an ethylene propylene copolymer outer layer on each side of the core layer, the core and outer layers containing no slip agent and one of the outer layers being corona treated.

In accordance with yet another aspect of the present invention the oriented polypropylene film substrate includes a metal coating on the corona treated outer layer.

The films provided in accordance with the present invention are particularly suited for use in flexible packaging applications. The metallized coating acts to provide good barrier properties and the ethylene propylene copolymer outer layer on the other side of the core layer provides good seal properties.

DESCRIPTION OF SPECIFIC EMBODIMENTS

The polypropylene films, according to this invention, are coextruded in a known manner. The homopolymer polypropylene core layer is 80% to 100% isotactic, and preferably 95% to 96% isotactic, that is they have a type of polymeric molecular structure containing a sequence of regularly spaced asymmetric atoms arranged in like configuration in the polymer chain. Further, the homopolymer polypropylene core layer has a melt index of from about 2 to about 10 grams/10 minutes, and preferably a melt index of about 3.5-6 grams/10 minutes.

The ethylene propylene copolymer outer layers consist essentially of from about 2.5% to about 3.5% by weight of ethylene and from about 97.5% to about 96.5% by weight of propylene. Preferably such outer layers each consist of about 3% by weight of ethylene and about 97% by weight of propylene.

An essential aspect of the present invention is that the core and outer layers contain no slip agents which as will be described hereinafter adversely affect the adhesion of the film to a metallized coating. The coextruded film substrate may typically have a total thickness in the order of 0.7 mils. Each of the outer layers comprise about 2.5% to about 8.0% by weight of the total coextruded film substrate whereas the core layer comprises about 95% to about 84.0% by weight of the coextruded film substrate, preferably each of the outer layers comprise 4% by weight, and the core layer comprises 92% by weight of the coextruded film substrate.

The coextruded film substrate is biaxially oriented and only one of the ethylene propylene copolymer outer layers is treated in an known manner by a corona discharge to about 35-60 dynes/cm., and preferably to about 35-40 dynes/cm. Only one of the outer layers is subjected to this corona treatment because such treatment reduces the seal properties of such layer although it improves the adhesion to metallized coating aspect of such layer.

Thereafter, a metallized coating is applied to the corona treated outer layer by any of known methods, for example, electroplating, sputtering and vacuum metallizing. A preferred method of metallizing the corona treated outer layer is by vacuum deposition. However when using the vacuum metallizing process, the use of chemical primers is not necessary to obtain enhanced adhesion of the metallized coating to the substrate.

The metal coating may be any of typical metals such as aluminum, copper, silver and chromium.

The present invention contemplates coextruding a film substrate having a homopolymer polypropylene core layer and an ethylene propylene copolymer outer layer on only one side of the core layer. The other side of the core layer may be suitably treated to provide the prerequisite seal properties or may be coextruded with an outer layer of a material other than ethylene propylene copolymer but having the needed seal capacity.

The following Table lists the results of bond tests using a homopolymer polypropylene film as a control. The test procedure for this test consisted of adhesively laminating the metallized film to an oriented polypropylene film with a two component alcohol reducible urethane adhesive. The metallized surface is buried in the lamination. The lamination is cut into 1 in. strips and a separation is started between the plys so that two free tails exist. The tails are placed in the jaws of a suter tester and separated at a 90° angle with a 12 in./min. recorded as grams/in. bond strength. The mode of failure is recorded as Complete Metal Lift (CML) or No Metal Lift (NML).

TABLE

| Layer Resin Type | Bond Level g/in. |
|---|---|
| Homopolymer Polypropylene Control | 20 CML |
| Ethylene Propylene Copolymer - 3% Ethylene | 250 NML |
| Medium Density Polyethylene | 250 NML |

Tests (2) and (3) were on a coextruded homopolymer polypropylene core having ethylene propylene copolymer 3% ethylene outer layers, and a homopolymer polypropylene core having medium density polyethylene outer layers, respectively. Each of these test film substrates were oriented, contained no slip agents and were corona treated.

It will be noted from the bond levels of the Table that a surprisingly small amount (3%) of ethylene provided an excellent metal bond for the ethylene propylene copolymer outer layer embodiment whereas the homopolymer polypropylene control provided a very unsatisfactory bond level.

What is claimed is:

1. A metal coated oriented polypropylene substrate comprising:
    a film comprising a homopolymer polypropylene layer which is from about 80% to 100% isotactic and has a melt index of from about 2 to about 10 grams/10 minutes;
    a coextruded ethylene propylene copolymer layer on at least one side of said polypropylene layer, said copolymer containing from about 2% to about 4% by weight of ethylene and from 96% to about 98% by weight of propylene, said polypropylene layer and said copolymer layer containing no slip agent and being biaxially oriented;
    at least one copolymer layer being corona discharge treated to provide a surface having enhanced adhesion to a metallized coating; and
    a metallized coating on said corona discharge treated copolymer layer, said metallized coating being of a metal selected from the group consisting of aluminum, copper, silver and chromium.

2. The metal coated substrate of claim 1 having said copolymer on one side of said homopolymer layer.

3. The metal coated substrate of claim 1 having a copolymer layer on both sides of said homopolymer layer and one copolymer layer being corona discharge treated.

4. A metal coated oriented polypropylene substrate comprising:
    a film comprising a homopolymer polypropylene layer which is from about 80 to 100% isotactic and has a metal index of from about 2 to about 10 grams/10 minutes;
    a coextruded ethylene propylene copolymer layer on at least one side of said polypropylene layer, said copolymer containing from about 2% to about 4% by weight of ethylene and from 96% to about 98% by weight of propylene, said polypropylene layer and copolymer layer containing no slip agent which adversely affects the adhesion of the substrate to a metallized coating, said layers being biaxially oriented;
    at least one copolymer layer being corona discharge treated to provide a surface having enhanced adhesion to a metallized coating; and
    a metallized coating on said corona discharge treated copolymer layer, said metallized coating being of a metal selected from the group consisting of aluminum, copper, silver and chromium.

5. The metal coated substrate of claim 4 having said copolymer on one side of said homopolymer layer.

6. The metal coated substrate of claim 4 having a copolymer layer on both sides of said homopolymer layer and one copolymer layer being corona discharge treated.

7. A method for producing a metal coated oriented polypropylene substrate comprising:
    coextruding a homopolymer polypropylene layer which is from about 80% to 100% isotactic and has a melt index of from about 2 to about 10 grams/10 minutes with an ethylene propylene copolymer layer on at least one side of said polypropylene layer, said copolymer containing from about 2% to about 4% by weight of ethylene and from about 96% to about 98% by weight of propylene, said layer containing either no slip agent or no slip agent which adversely affects the adhesion of the substrate to a metallized coating;
    biaxially orienting said film substrate;
    subjecting at least one copolymer surface to corona discharge treatment to enhance adhesion of a metallized coating thereto; and
    applying a metallized coating to the corona discharge treated surface, said metallized coating being of a metal selected from the group consisting of aluminum, copper, silver and chromium.

* * * * *